(12) United States Patent
Asai et al.

(10) Patent No.: US 8,817,200 B2
(45) Date of Patent: Aug. 26, 2014

(54) LIQUID CRYSTAL DISPLAY DEVICE COMPRISING A TFT WITH A BARRIER METAL FORMED OF A FIRST LAYER AND A SECOND LAYER WHEREIN THE FIRST LAYER IS DENSER THAN THE SECOND LAYER

(75) Inventors: Taro Asai, Chiba (JP); Jun Gotoh, Mobara (JP); Eiji Oue, Mobara (JP); Hiroaki Asuma, Mobara (JP); Katsumi Nakayashiki, Miyazaki (JP); Makoto Kurita, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 280 days.

(21) Appl. No.: 13/028,339

(22) Filed: Feb. 16, 2011

(65) Prior Publication Data

US 2011/0199551 A1 Aug. 18, 2011

(30) Foreign Application Priority Data

Feb. 17, 2010 (JP) ................................. 2010-032439

(51) Int. Cl.
  *G02F 1/136* (2006.01)
  *G02F 1/1343* (2006.01)
(52) U.S. Cl.
  USPC ............................................ 349/43; 349/140
(58) Field of Classification Search
  USPC ........................ 349/42, 43, 140; 2/42, 43, 140
  See application file for complete search history.

(56) References Cited

U.S. PATENT DOCUMENTS

| 2003/0201716 A1 | 10/2003 | Yamazaki et al. | |
| 2005/0122443 A1* | 6/2005 | Kim et al. | 349/46 |
| 2009/0050896 A1 | 2/2009 | Kaitoh et al. | |
| 2009/0225251 A1* | 9/2009 | Kaitoh et al. | 349/46 |

FOREIGN PATENT DOCUMENTS

| JP | 11-017189 | 1/1999 |
| JP | 2001-350159 | 12/2001 |
| JP | 2003-317971 | 11/2003 |
| JP | 2005-109347 | 4/2005 |
| JP | 2005-116592 | 4/2005 |
| JP | 2007-142059 | 6/2007 |
| JP | 2009-049244 | 3/2009 |
| JP | 2009-211009 | 9/2009 |

* cited by examiner

*Primary Examiner* — Paul Lee
(74) *Attorney, Agent, or Firm* — Antonelli, Terry, Stout & Kraus, LLP.

(57) ABSTRACT

A contact resistance in a through-hole with a source or a drain electrode connected to a TFT is decreased, thereby improving the operation efficiency of a display device.

In the through-hole, a source portion of the TFT is connected to a source electrode 8. The source electrode 8 is formed of three layers comprising a barrier metal, an Al alloy 82, and a cap metal 83. The barrier metal is divided into a lower layer 81a in contact with the semiconductor layer and an upper layer 81b in contact with the Al alloy. The lower layer 81a of the barrier metal is formed by sputtering, the lower layer 81a is heat-treated and, subsequently, an upper layer 81b of the base metal, the Al alloy 82, and the cap metal 83 are formed continuously by sputtering. Since the upper layer 81b of the barrier metal in contact with the Al alloy 82 is not oxidized, increase in the contact resistance in the through-hole can be prevented.

4 Claims, 4 Drawing Sheets

US 8,817,200 B2

LIQUID CRYSTAL DISPLAY DEVICE COMPRISING A TFT WITH A BARRIER METAL FORMED OF A FIRST LAYER AND A SECOND LAYER WHEREIN THE FIRST LAYER IS DENSER THAN THE SECOND LAYER

CLAIM OF PRIORITY

The present application claims priority from Japanese Patent Application JP 2010-032439 filed on Feb. 17, 2010, the content of which is hereby incorporated by reference into this application.

BACKGROUND OF THE INVENTION

1. Field of the Invention

The present invention relates to a display device. The invention more particularly relates to an active matrix type display device which is improved in the response speed or the emission efficiency by decreasing the contact resistance in a through-hole.

2. Description of the Related Art

In an organic EL display device or a liquid crystal display device, scanning lines are extended in a first direction and arranged in a second direction. Further, video signal lines are extended in the second direction and arranged in the first direction. Areas surrounded by the scanning lines and the video lines define pixels and a thin film transistor (TFT) is formed for each of the pixels.

The organic EL display device is configured to control current supplied to an organic EL layer by a TFT while the liquid crystal display device is operated to select signals on images supplied to pixel electrodes. The TFT is formed of a-Si or poly-Si.

In the organic EL display device, since the organic EL layer is driven by the current, it is necessary to increase the mobility of a semiconductor constituting the TFT. Further, a small-sized liquid crystal display device is such that a driving circuit is mounted in a liquid crystal display panel. Since high speed operation is necessary for the TFT for the driving circuit, it is necessary to increase the mobility of the semiconductor. Accordingly, a poly-Si TFT is used in the organic EL display device or the small-sized liquid crystal display device.

Generally, to form a poly-Si semiconductor layer, an a-Si semiconductor layer is first formed and then excimer laser is radiated to the a-Si semiconductor laser to convert a-Si into poly-Si. Installation investment is necessary and process control is difficult for the radiation of the excimer laser. In view of this, JP-A-2007-142059 that a semiconductor layer of poly-Si is formed by radiating an a-Si semiconductor layer not by the excimer laser but by light of a lamp.

SUMMARY OF THE INVENTION

Generally, to form the poly-Si TFT, a semiconductor layer is formed first and a gate electrode is formed above the semiconductor layer, with a gate insulation film being sandwiched therebetween. An interlayer insulation film is then formed above the gate electrode. A source electrode or a drain electrode (hereinafter represented typically by the source electrode) is formed above the interlayer insulation film. The source electrode is in a layer in which the video signal line extends. An inorganic SiN passivation film is formed above the source electrode for protection of the entire TFT and an organic passivation film is formed above the inorganic SiN passivation film.

The source electrode is connected by way of a through-hole formed in the interlayer insulation film to a source portion of the semiconductor layer. An Al alloy is used for the source electrode which is formed in a layer in which the video signal line extends so as to decrease the resistance. However, Al atoms tend to migrate. The Al atoms are diffused to a semiconductor layer when they are passed through a thermal step or operated for a long period of time, resulting in the characteristics of the TFT changed.

In order to prevent this, a barrier metal such as MoW is formed as an underlayer for the Al alloy in the source electrode. While the barrier metal is formed by sputtering, the barrier metal in the state as sputtered has no sufficient barrier effect for Al. Accordingly, after the barrier metal is formed, it is necessary to subject the same to a heat treatment to increase the density of the barrier metal thereby improving the barrier effect. However, the heat treatment step results in a phenomenon of oxidizing the battier metal. When the barrier metal is oxidized, Al is oxidized thereby resulting in a problem of increasing the contact resistance with respect to the Al alloy.

FIGS. 8 to 12 show a process of forming a poly-Si TFT according to the existent method described above. In FIG. 8, a first underlayer 2 of SiN is first formed on a substrate 1, and a second underlayer 3 of $SiO_2$ is formed on the first underlayer 2. They are formed for preventing impurities contained in the glass substrate 1 from contaminating a semiconductor layer 4. Subsequently, an a-Si film is formed as the semiconductor layer 4. An excimer layer is radiated to the a-Si film to convert it into a poly-Si film. Then, the semiconductor layer 4 is patterned by photolithography.

In FIG. 9, after a gate insulation film 5 is formed on the semiconductor 4 layer, ions are injected into the semiconductor 4 layer by implantation. The conduction type of the channel portion is defined to either a p-type or n-type by the ion injection. After the ion injection, a heat treatment is applied for the entire substrate 1. This step is performed for driving atoms injected by ion implantation into the semiconductor layer 4 and activating them.

Subsequently, a gate metal is formed over the gate insulation film 5 by sputtering, and the gate metal is fabricated by photolithography to form a gate electrode 6. Although not illustrated in FIG. 9, an impurity such as P or Bo is injected by ion implantation using the gate electrode 6 as a mask to form a drain portion or a source portion in the semiconductor layer 4. The drain portion or the source portion is in contact with a drain electrode or a source electrode 8.

In FIG. 10, an interlayer insulation film 7 is formed on the gate electrode 6 by plasma CVD, etc. After the interlayer insulation film 7 is formed, a heat treatment is performed for the entire substrate 1 and the ions injected into the drain portion or the source portion of the semiconductor layer 4 are driven into the inside and activated. Subsequently, a through-hole is formed in the interlayer insulation film 7 and the gate insulation film 5 such that the drain portion or the source portion of the semiconductor layer 4 can be in contact with the drain electrode or the source electrode 8.

In FIG. 11, a barrier metal is formed on the interlayer insulation film 7 by sputtering. The barrier metal is formed, for example, of MoW. The barrier metal can be also formed by high melting point metals typically represented by Mo, Ti, Ta, Mn, Ru, V, and Co, and compounds or alloys thereof. Since the barrier metal is sputtered also in the through-hole in the interlayer insulation film 7, the drain electrode or the source electrode 8 can be in contact with the drain portion or the source portion of the semiconductor layer 4.

While the barrier metal serves as a barrier for an Al alloy 82 to be sputtered subsequently, the barrier metal does not form a sufficiently dense film only by sputtering. To attain the barrier effect, it is necessary to subject the sputtered barrier metal to a heat treatment.

The heat treatment is performed, for example, in an $N_2$ atmosphere after the substrate 1 is taken out from a sputtering device into atmospheric air. The surface of the barrier metal is oxidized when the substrate 1 is placed under the atmospheric air.

As shown in FIG. 12, an Al alloy 82 used to form the drain electrode or the source electrode 8 is sputtered over the barrier metal. If the surface of the barrier metal is oxidized, then this oxidizes Al in contact with the barrier metal to increase the contact resistance in the through-hole. If the contact resistance increases, current that allows an organic El layer to emit light cannot be sufficiently obtained in an organic EL display device and the switching characteristics are deteriorated in a liquid crystal display device.

The present invention intends to prevent the increase of the contact resistance in the through-hole.

In accordance with the invention, to overcome the problem described above, a source electrode to be connected with the source portion of a TFT is formed with three layers comprising a barrier metal, an Al alloy, and a cap metal. The barrier metal is formed in such a manner as to be divided into two layers comprising a lower layer in contact with the source portion of the TFT and an upper layer in contact with the Al alloy.

First, after the lower layer of the barrier metal is formed by sputtering, the substrate is taken out of a chamber and subjected to a heat treatment. The heat treatment is performed for increasing the density of the film structure in the lower layer of the barrier metal to provide the barrier effect. Subsequently, the substrate is again loaded in the vacuum chamber, the upper layer, the Al alloy, and the cap metal of the barrier metal are formed continuously by sputtering.

While the lower layer of the barrier metal is oxidized when taken out into the atmospheric air, the layer is covered by the upper layer of the barrier metal sputtered subsequently in vacuum, and the barrier metal and the Al alloy are not in contact with each other. Thus the Al in the Al alloy is not oxidized and the contact resistance can be kept lower.

According to the invention, since the contact resistance between the TFT and the drain electrode or the source electrode is decreased, rise of the driving voltage can be suppressed in the organic EL display device and, as a result, the emission efficiency of the organic EL display device can be improved.

Further, in the liquid crystal display device, since the contact resistance between the TFT and the source electrode in the through-hole can be decreased, the operation speed of the driving circuit can be increased, particularly, when the driving circuit is formed by the TFT.

DESCRIPTION OF THE PREFERRED EMBODIMENTS

Figure 1:
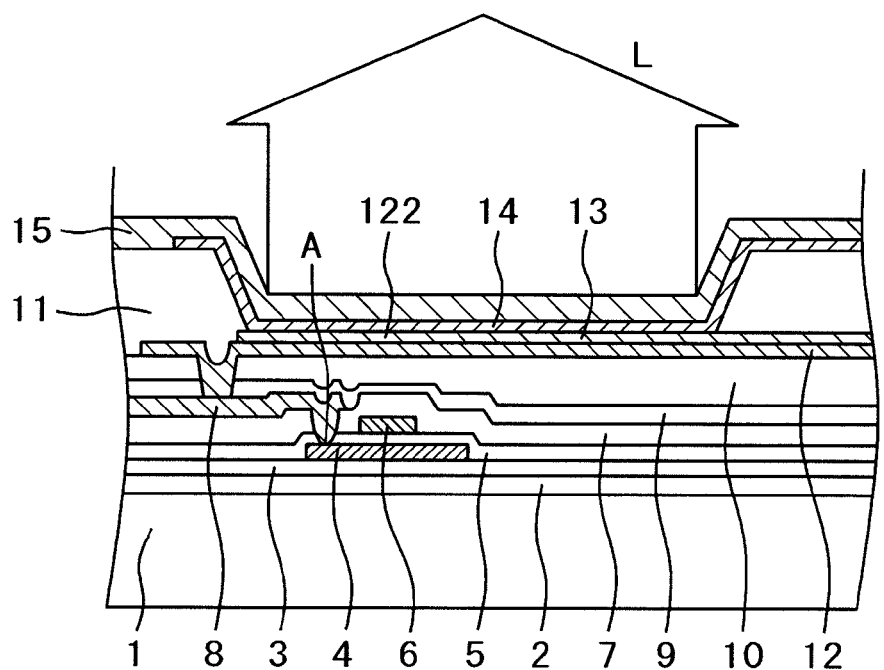
FIG. 1 is a cross sectional view for a pixel portion of an organic EL display device.

The present invention is to be described for an example of applying the invention to an organic EL display device. Before explanation of a specific example, outline of the organic EL display device is to be described. FIG. 1 is a cross sectional view for a pixel portion in the organic EL display device to which the invention is applied. One type of the organic EL display device is a top emission type in which light from an organic EL layer 14 is emitted on the side opposite to the side of a substrate 1. Another type of the organic EL display device is a bottom emission type in which light from the organic EL layer 14 is emitted on the side of the substrate 1.

FIG. 1 is an example of the top emission type in which light is emitted in the direction of a blank arrow L. The top emission type is advantageous in terms of screen brightness since a large emission area is available. The organic EL display device has a plurality of organic layers sandwiched between a lower electrode 13 and an upper electrode 15. The upper electrode 15 is referred to as a top anode in the case where the upper electrode 15 is an anode, and referred to as a top cathode in the case where the upper electrode 15 is a cathode.

Generally, the top cathode type is often used since the anode side is stable to the circumstance. That is, it is convenient to use the lower electrode 13 as a stable anode because, in some cases, a certain manufacturer prepares TFT substrates including portions formed up to the lower electrode 13 and sells them another manufacturer, and another manufacturer forms the organic EL layer 14 and the upper electrode 15 thereon.

In FIG. 1, a first underlayer 2 formed of SiN and a second underlayer 3 formed of $SiO_2$ are deposited over a device substrate 1 formed of glass. Both the first underlayer 2 and the second underlayer 3 play a role of preventing impurities from the glass from contaminating the semiconductor layer 4.

A poly-Si semiconductor layer 4 is formed on the second underlayer 3. An a-Si semiconductor layer 4 is first formed, and converted into a poly-Si film by annealing the a-Si film using an excimer laser. Ion implantation and subsequent heat treatment are applied to the poly-Si thereby defining the conduction type of the semiconductor layer 4 to the p-type or the n-type.

A gate insulation film 5 is formed over the semiconductor layer 4. A gate electrode 6 is formed on the gate insulation film 5. P or B are injected by ion implantation using the gate electrode 6 as a mask and then activated by a heat treatment to form a drain portion or a source portion of high electroconductivity to the semiconductor layer 4.

An interlayer insulation film 7 is formed on the gate electrode 6. The interlayer insulation film 7 plays a role of insulating the gate electrode 6 or a gate interconnection from the video signal line or the drain electrode and the source electrode 8 which are formed in a layer in which the video signal line extends. A through-hole is formed in the interlayer insulation film 7 by photolithography.

Video signal lines and the drain electrode and the source electrode 8 and which are formed in a layer in which the video signal line extends are formed on the interlayer insulation film 7. Since only the source electrode 8 is shown on the interlayer insulation film 7 in FIG. 1, they are typically represented by the source electrode 8. The source electrode 8 is formed of an Al alloy 82 with a large thickness in order to decrease the electric resistance.

Al is instable and tends to diffuse into other layers. Since Al deteriorates the characteristics of the TFT when it diffuses into the semiconductor layer 4, a barrier metal is formed so that Al does not diffuse into the semiconductor layer 4. As described later, the invention has a feature of forming the barrier metal with two layers, suppressing the increase in the contact resistance between the Al alloy and the barrier metal, and decreasing the contact resistance in the through-hole.

Further, Al generates hillock when subjected to a heat treatment. When the hillock is generated, it breaks through the insulation film to short circuit the source electrode 8 and the electroconduction layer of a counter electrode. In order to prevent the hillock, a cap metal 83 is formed on the Al alloy 82 to suppress the development of hillock of Al. In this example, while both the barrier metal and the cap metal 83 are formed of MoW, this is not particularly restricted and they may be formed of a high melting point metal typically represented, for example, by Mo, Ti, Ta, Mn, Ru, V, or Co, and compounds or alloys thereof.

An inorganic passivation film 9 is formed by CVD to cover the source electrode 8. The inorganic passivation film 9 protects the entire TFT. An organic passivation film 10 is formed to cover the inorganic passivation film 9, with the organic passivation film 10 also serving as a planarizing film. Since the organic passivation film 10 plays a role of serving as a planarizing film, the organic passivation film 10 formed has a thickness as large as about 1 to 4 μm.

To establish contact between the source electrode 8 and the lower electrode 13 of the organic EL layer 14, a through-hole is formed in the organic passivation film 10 and the inorganic passivation film 9. Subsequently, an Al alloy is formed by a sputtering method or the like to establish the contact between the lower electrode 13 of the organic EL layer 14 and the source electrode 8. Since the Al alloy has a high reflectance, the Al alloy plays a role of serving as a reflection electrode 12 for the top emission type.

ITO is deposited as the lower electrode 13 of the organic EL layer 14 on the Al alloy as the reflection electrode 12. Since ITO has a large work function, ITO can be used as an anode for the organic EL layer 14. After deposition of ITO, ITO is subjected to a heat treatment such that it has a decreased resistivity.

The organic EL layer 14 is formed on the lower electrode 13. The organic EL layer 14 generally has a 5-layered structure comprising a hole injection layer, a hole transport layer, an emission layer, an electron transport layer, and an electron injection layer from the side of the lower electrode 13. IZO is deposited as a cathode on the electron injection layer. The cathode is an upper electrode 15.

A bank 11 is formed between pixels in order to prevent destruction of the organic EL layer 14 caused by disconnection of step at the end. The bank 11 may be formed of an organic material or formed of an inorganic material such as SiN. When the organic material is used, the bank 11 is generally formed of an acrylic resin.

The emission characteristics of the organic El layer 14 are degraded when moisture is present. Accordingly, for the substrate 1 shown in FIG. 1, the side thereof formed with the TFT and the organic El layer is sealed by a sealing substrate formed of glass (not shown). The substrate 1 having the organic EL layer 14, etc. formed thereover and the sealing substrate 1 are sealed at the periphery of them.

The present invention is configured to prevent increase in the contact resistance in the through-hole portion that establishes the contact between the source electrode 8 and the source portion of the semiconductor layer 4 at the portion indicated by A. In the invention, this is true not only for the portion A but also for the contact, for example, between the drain electrode and the drain portion of the semiconductor layer 4 in FIG. 1.

The present invention is to be described specifically by way of examples.

EXAMPLE 1

Figure 2:
FIG. 2 is a cross sectional view in a state where a semiconductor layer is formed in a substrate in the invention.
Figure 3:
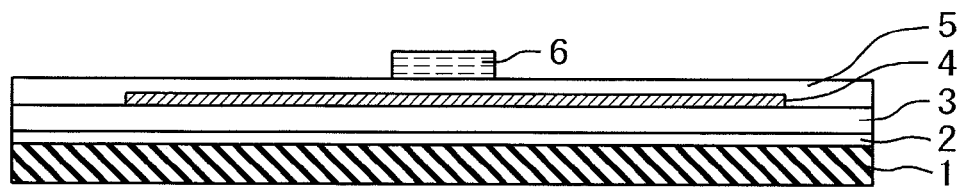
FIG. 3 is a cross sectional view in a state where a gate electrode is formed in a substrate in the invention.
Figure 4:
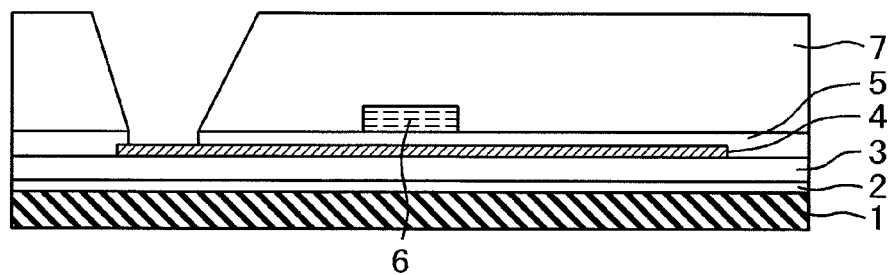
FIG. 4 is a cross sectional view in a state where an interlayer insulation film is formed to the substrate and a through-hole is formed in the invention.
Figure 8:
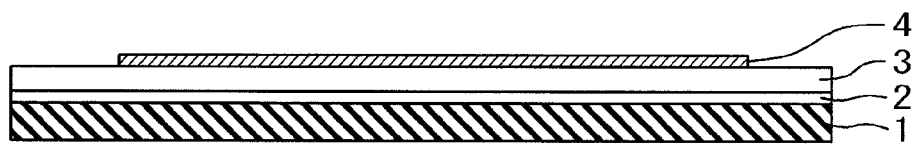
FIG. 8 is a cross sectional view in a state where a semiconductor layer is formed in a substrate in an existent example.
Figure 9:
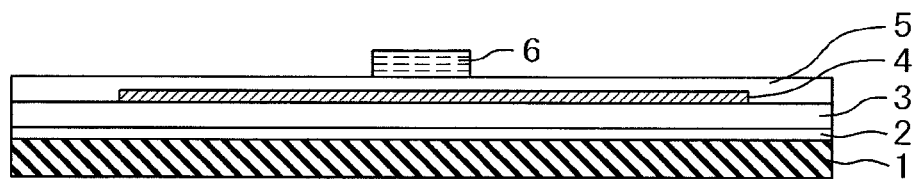
FIG. 9 is a cross sectional view in a state where a gate electrode is formed in the substrate of the existent example.
Figure 10:
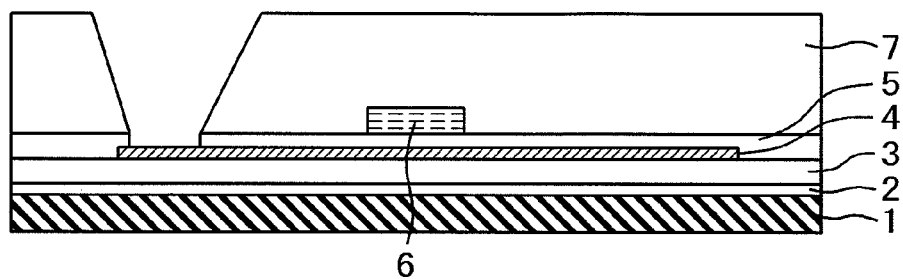
FIG. 10 is a cross sectional view in a state where an interlayer insulation film is formed to the substrate and a through-hole is formed in the existent example.
Figure 11:
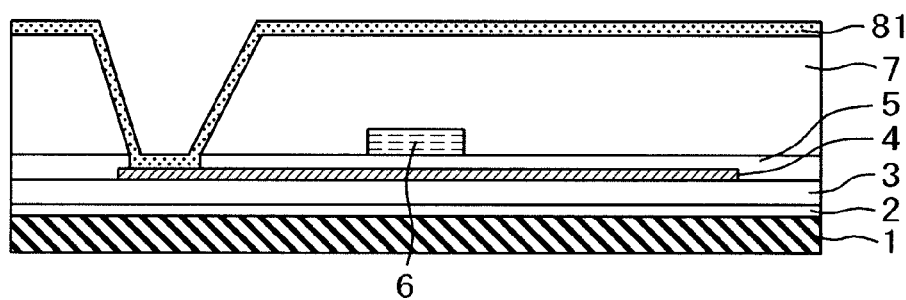
FIG. 11 is a cross sectional view showing a state where a barrier metal is formed in the existent example.
Figure 12:
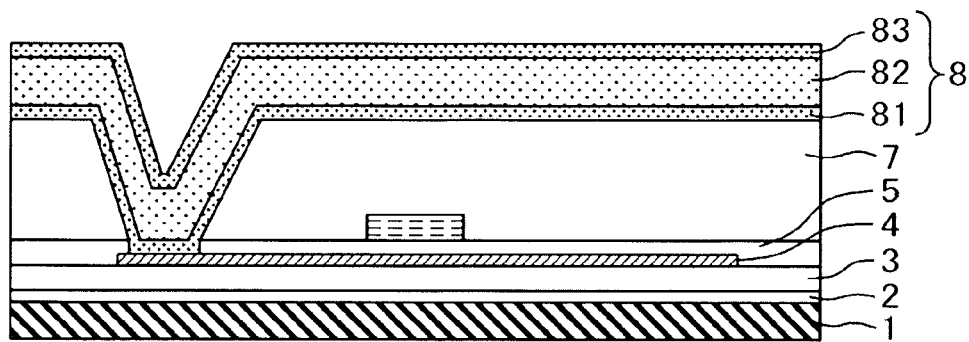
FIG. 12 is a cross sectional view showing a state where a source electrode is formed in the existent example.

FIGS. 2 to 6 show a process up to the formation of the source electrode 8 in the organic EL display device shown in FIG. 1. Since FIGS. 2 to 4 are identical with FIGS. 8 to 10 that have been explained for the existent example, explanation for them is to be omitted. That is, the process up to the state in FIG. 4 where the through-hole is formed in the interlayer insulation film 7 and the gate insulation film 5 is identical with that in the existent example.

Similarly to the existent example, the source electrode 8 has the three layered structure comprising the barrier metal, the Al alloy 82, and the cap metal 83. The feature of the invention is to deposit the barrier metal film divided into two layers. That is, a lower layer 81a of the battier metal serves to prevent the Al atoms from diffusing into the poly-Si semiconductor layer 4. This is a primary role as the barrier metal. An upper layer 81b of the barrier metal serves to decrease the contact resistance in the through-hole by enhancing the contact between the upper layer 81b of the barrier metal and the Al alloy 82. The term Al alloy 82 is used herein in the meaning of Al-containing metals.

Figure 5:
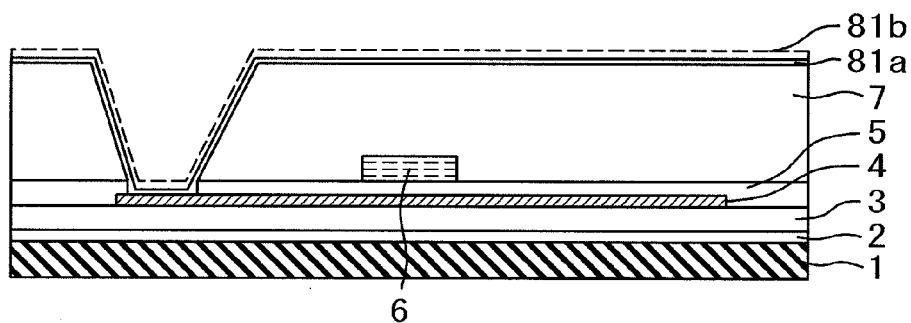
FIG. 5 is a cross sectional view showing a state where a two layered barrier metal is formed in the invention.

In FIG. 5, the lower layer 81a of the barrier metal is first formed by sputtering MoW. The thickness of the lower layer 81a of the barrier metal is, for example, about 30 nm. Since MoW after being deposited by sputtering is in an amorphous state, MoW has an insufficient barrier effect. Then, the substrate 1 sputtered with MoW is taken out of a sputtering apparatus, loaded in a heating furnace and subjected to a heat treatment to convert the MoW film into a dense film, whereby a sufficient barrier effect is provided.

However, since the substrate 1 is taken out into atmospheric air in a state where MoW is deposited, the surface of MoW is oxidized. Further, while heating for the substrate 1 is performed in a nitrogen atmosphere, since oxygen remains slightly in nitrogen, oxidation of MoW also proceeds during heating for the substrate 1. When the Al alloy 82 is deposited over the thus oxidized MoW, Al in the Al alloy 82 is oxidized to form $Al_2O_3$. Since $Al_2O_3$ is an insulator, the contact resistance between the Al alloy 82 and MoW increases.

In the organic EL display device, if the contact resistance in the through-hole increases, voltage rises when a current is supplied to the organic EL layer 14. Further, the power consumption also increases. Accordingly, the contact resistance in the through-hole should be as low as possible.

In the present invention, after the lower layer 81a of the barrier metal is formed of MoW and then subjected to a heat treatment such that it has a barrier effect, the upper layer 81b of the barrier metal is formed of MoW before formation of the Al alloy 82. The upper layer 81b of the barrier metal is shown by a dotted line in FIG. 5. The thickness for MoW of the upper layer 81b of the barrier metal is, for example, 13 nm.

The upper layer 81b of the barrier metal serves to enhance the contact with the Al alloy 82 and, and the lower layer 81a of the barrier metal serves to provide the barrier effect against Al. Thus the upper layer 81b does not need have a large thickness. By contrast, since it is necessary that the lower layer 81a of the barrier metal provide the essential barrier effect, the lower layer 81a needs to have a predetermined thickness. That is, the lower layer 81a of the barrier metal is formed to a thickness larger than that of the upper layer 81b of the barrier metal.

Then, an Al alloy 82 playing a primary role of the source electrode 8 is formed by sputtering. In the invention, the Al alloy 82 is AlSi. The Al alloy 82 is formed to a thickness as large as about 250 nm to decrease the resistance. Subsequently, MoW is formed as a cap metal 83 to a thickness of about 75 nm on the Al alloy 82 by sputtering. The cap metal 83 plays a role of suppressing hillock of Al. Then, a metal layer comprising the barrier metal, the Al alloy 82, and the cap metal 83 is patterned by photolithography to form a source electrode 8, a drain electrode, a video signal line, etc.

Since the upper layer 81b of the barrier metal serves to enhance the contact with the Al alloy 82 and the lower layer 81a of the barrier metal serves to provide the barrier effect, the upper layer 81b may be in an amorphous state as sputtered. That is, after sputtering it is not necessary to subject the barrier metal (upper layer 81b) to a heat treatment to form a dense film. Accordingly, the upper layer 81b of the barrier metal, the Al alloy 82 and, further, the cap metal 83 can be formed continuously in the chamber without breaking a vacuum state.

In the invention, the barrier metal is formed of two layers. However, as described above, the upper layer 81b of the barrier metal can be sputtered continuously with the Al alloy 82 and the cap metal 83 in one identical vacuum chamber. Since the thickness of the upper layer 81b of the barrier metal is 13 nm, the thickness of the Al alloy 82 is 250 nm, and the thickness of the cap metal 83 is 75 nm, increase in the tact time caused by the sputtering of the upper layer 81b of the barrier metal is extremely small. That is, the process time scarcely increases even when the invention is practiced.

Figure 6:
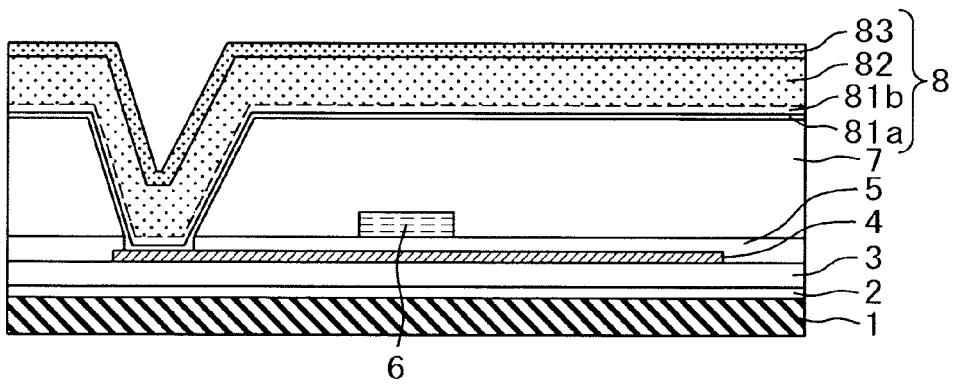
FIG. 6 is a cross sectional view showing a state where a source electrode is formed in the invention.
Figure 7:
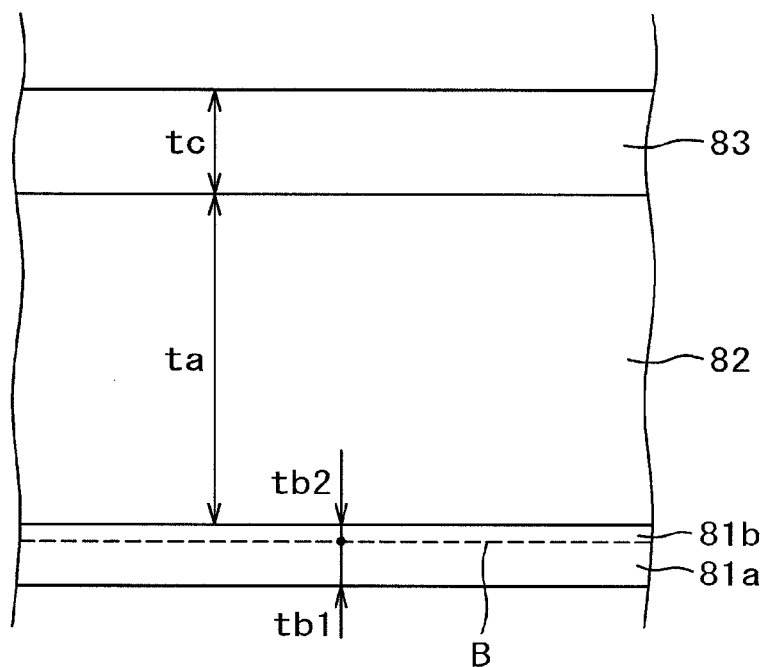
FIG. 7 is a cross sectional view of a source electrode in the invention.

FIG. 7 is a cross sectional view showing only the source electrode 8 in FIG. 6. In FIG. 7, the source electrode 8 comprises a barrier metal, an Al alloy 82, and a cap metal 83 in which the barrier metal is divided into a lower layer 81a and an upper layer 81b. In FIG. 7, the thickness tb1 of the lower layer 81a of the barrier metal is 26 nm, the thickness tb2 of the upper layer 81b of the barrier metal is 13 nm, the thickness to of the Al alloy 82 is 250 nm, and the thickness tc of the cap metal 83 is 75 nm.

In FIG. 7, since the lower layer 81a of the barrier metal undergoes the heat treatment, a dense crystal structure is formed. By contrast, since the upper layer 81b of the barrier metal is in a state as sputtered, this is in a substantially amorphous state. Further, since the crystal grain boundary formed in the lower layer 81a of the barrier metal is disconnected at a portion of the dotted line B corresponding to the boundary between the lower layer 81a and the upper layer 81b shown in FIG. 7, the boundary can be observed, for example, by TEM and SEM.

Further, a great amount of oxygen is contained in the lower layer 81a of the barrier metal and in the boundary between the barrier metal lower layer 81a/barrier metal upper layer 81b shown in FIG. 7, whereas oxygen is scarcely contained in the upper layer 81b of the barrier metal and in the boundary between the barrier metal upper layer 81b/Al alloy 82. Accordingly, by executing elemental analysis for the upper layer 81b and the lower layer 81a of the barrier metal with the use of SIMS or the like it can be confirmed that the two layers of the lower layer 81a and the upper layer 81b are formed.

The serial resistance of a plurality of through-hole portions for use in the source electrode 8 according to the configuration of the invention as in FIG. 7 was compared with the serial resistance of a plurality of through-hole portions in which the source electrode 8 according to the existent configuration is used. As a result, while the serial resistance of the through-hole portions according to the configuration of the invention was 27.8Ω, the serial resistance of the through-hole portions according to the existent configuration was 112.9Ω. The serial resistance in the invention is ¼ or less of the serial resistance in the existent example and the effect of the invention is remarkable.

Description has been made of the example of the through-hole near the TFT in the display area of the organic EL display device. In the case where a driving circuit is formed by a TFT at the periphery of the display area, the present invention is applicable in the same manner also to the through-hole at the periphery of the TFT of the driving circuit.

In the foregoing description, while the organic EL display device has been explained as an example, the TFT is used also in a liquid crystal display device in the same manner as in the organic EL display device. In particular, in a liquid crystal display device incorporating a driving circuit at the periphery of the display area by using a poly-Si TFT, the contact resistance in the through-hole portion gives a significant effect on the operation speed of the driving TFT. When the invention is applied to such a liquid crystal display device, a liquid crystal display device incorporating a high performance driving circuit can be attained. When the invention is applied to the driving TFT of the driving circuit in such a liquid crystal display device, the invention is applicable also to the switching TFT in the display area.

What is claimed is:

1. The liquid crystal display device comprising:
    scanning lines extended in a first direction and arranged in a second direction;
    video signal lines extended in the second direction and arranged in the first direction;
    pixels, each of which is formed in an area surrounded by one of the scanning lines and the video signal lines, each of the pixels including a switching TFT for switching a video signal supplied to a pixel electrode; and,
    driving TFTs, each of which includes a semiconductor layer, at the periphery of a display area;
        wherein a source electrode connected with the semiconductor layer of the driving TFT is formed of three layers comprising a barrier metal, an Al-containing metal and a cap metal,
        wherein the Al-containing metal is formed on the barrier metal, and the cap metal is formed on the Al-containing metal,
    wherein the barrier metal is formed of a first layer in contact with the semiconductor layer of each of the driving TFTs and a second layer in contact with the Al-containing metal, and wherein each of the first layer, the second layer, and the cap metal is formed of a metal comprising a high melting point metal wherein the thickness of the first layer is thicker than the thickness of the second layer, and wherein the first layer is denser than the second layer.

2. The liquid crystal display comprising:

scanning lines extended in a first direction and arranged in a second direction;

video signal lines extended in the second direction and arranged in the first direction;

pixels, each of which is formed in an area surrounded by one of the scanning lines and the video signal lines, each of the pixels including a switching TFT for switching a video signal supplied to a pixel electrode; and, driving TFTs, each of which includes a semiconductor layer, at the periphery of a display area;

wherein a source electrode connected with the semiconductor layer of the driving TFT is formed of three layers comprising a barrier metal, an Al-containing metal and a cap metal, wherein the Al-containing metal is formed on the barrier metal, and the cap metal is formed on the Al-containing metal, wherein the barrier metal is formed of a first layer in contact with the semiconductor layer of each of the driving TFTs and a second layer in contact with the Al-containing metal, and wherein each of the first layer, the second layer, and the cap metal is formed of a metal comprising a high melting point metal, wherein the thickness of the first layer is thicker than the thickness of the second layer, wherein the first layer is denser than the second layer, and wherein the first layer is in a crystal state and the second layer is in an amorphous state.

3. The liquid crystal display device according to claim 1, wherein the second layer comprises a layer which is formed on the first layer after the first layer has been subjected to a heat treatment to provide the first layer with a barrier effect.

4. The liquid crystal display device according to claim 2, wherein the second layer comprises a layer which is formed on the first layer after the first layer has been subjected to a heat treatment to provide the first layer with a barrier effect.

* * * * *